United States Patent [19]

Pfiester

[11] Patent Number: 4,876,213

[45] Date of Patent: Oct. 24, 1989

[54] SALICIDED SOURCE/DRAIN STRUCTURE

[75] Inventor: James R. Pfiester, Austin, Tex.

[73] Assignee: Motorola, Inc., Schaumburg, Ill.

[21] Appl. No.: 264,925

[22] Filed: Oct. 31, 1988

[51] Int. Cl.⁴ .................... H01L 21/265; H01L 2/70
[52] U.S. Cl. .......................... 437/34; 437/44;
437/56; 437/57; 437/200; 437/27; 357/23.3;
357/42; 156/662
[58] Field of Search .................... 437/27, 34, 40, 41,
437/44, 56, 57, 186, 200, 192, 202, 149, 150,
153, 154, 157, 235, 238, 974; 357/23.3, 23.9, 41,
42, 90; 156/654, 657, 662

[56] References Cited

U.S. PATENT DOCUMENTS

| 4,530,150 | 7/1985 | Shirato | 437/34 |
| 4,577,391 | 3/1986 | Hsia | 437/44 |
| 4,599,789 | 7/1986 | Gasner | 437/41 |
| 4,642,878 | 2/1987 | Maeda | 437/34 |
| 4,682,404 | 7/1987 | Miller et al. | 437/44 |
| 4,745,086 | 5/1988 | Parrillo et al. | 437/57 |
| 4,753,898 | 6/1988 | Parrillo et al. | 437/57 |
| 4,771,014 | 9/1988 | Liou et al. | 437/34 |

FOREIGN PATENT DOCUMENTS

| 0104167 | 6/1984 | Japan . |
| 0046071 | 3/1985 | Japan . |
| 0261171 | 12/1985 | Japan . |
| 0214474 | 9/1986 | Japan . |
| 0005321 | 9/1986 | World Int. Prop. O. . |

Primary Examiner—Olik Chaudhuri
Assistant Examiner—M. Wilczewski
Attorney, Agent, or Firm—John A. Fisher

[57] ABSTRACT

A process for fabricating a CMOS device using one sidewall spacer for both the source/drain implant and salicide formation, thereby providing an improved salicided source/drain structure. The use of one sidewall spacer for both the source/drain implant and the silicide formation facilitates the closer spacing of the silicide region to the gate edge. Prior to the salicidation, a silicon overetch is performed to remove the P+ implant in the source/drain and poly regions of the NMOST. The silicon overetch forms a concave surface on the N+ source/drain regions, which allows salicide formation closer to the edge of the channel. Due to the proximity of the edge of the silicide to the edge of the channel, the series resistance of the NMOST is significantly reduced.

5 Claims, 3 Drawing Sheets

SALICIDED SOURCE/DRAIN STRUCTURE

TECHNICAL FIELD

This invention relates to a method for fabricating a semiconductor device, and more particularly, to fabrication techniques for an improved salicided source/drain structure.

BACKGROUND OF THE INVENTION

The semiconductor industry is constantly optimizing the fabrication process for MOSFET devices. Current trends in VLSI fabrication of CMOS devices are toward reducing the number of photolithographic masking steps, while providing additional design benefits. The conventional CMOS fabrication process uses four different masking steps to perform four implantations in the NMOS/PMOS source/drain regions. One approach to process optimization is to reduce the number of masking steps, thereby minimizing process induced defects, and substantially reducing manufacturing cost.

Another approach to process optimization is to use self-aligned silicides (salicides) to improve the series resistance of the MOST. Typically, VLSI processes for fabrication of MOST, with shallow source/drain structures, require narrow sidewall spacer widths (e.g., 800 to 1,200 Å) for the N+source/drain implant. The use of the narrow spacer insures the alignment of the N+ ateral edge of the source/drain regions with the poly gate edge. In contrast, the use of a wider spacer may be required in VLSI processes using salicides. For example, if titanium disilicide is used as the salicide material, a wider spacer (e.g., 2,000 Å) is required to avoid bridging of the gate region to the source/drain regions during the salicide formation. Consequently, the use of salicides for the fabrication of MOS transistors with shallow source/drain structures imposes additional process constraints.

BRIEF DESCRIPTION OF THE INVENTION

Accordingly, an object of the present invention is to provide an improved process flow for a salicided source/drain structure.

Another object of the present invention is to provide an improved CMOS process which uses one sidewall spacer for both the source/drain implant and salicide formation.

Yet another object of the present invention is to provide an improved CMOS process for manufacturing an NMOST with improved series resistance.

In carrying out the above and other objects of the present invention, there is provided, in one form, a process for fabricating a CMOS device. A silicon substrate having first and second surface regions of first and second conductivity type, respectively, is provided. First and second polycrystalline silicon gate electrodes overlying the first and second surface regions are provided. Source and drain regions of second and first conductivity type, respectively, are formed, self aligned with the first and second gate electrodes. Sidewall spacers on the edges of each of the gate electrodes are formed. Impurities of the first conductivity type are introduced into the first and second surface regions using the sidewall spacers as masking elements. Impurities of the first conductivity type are removed from the surface region of the first conductivity type. Impurities of the second conductivity type are selectively introduced into the surface region of the first conductivity type using the sidewall spacers as masking elements. Silicide regions are formed on the first and second surface regions using the sidewall spacers as silicide masks.

DETAILED DESCRIPTION OF THE PRESENT INVENTION

Figure 1:
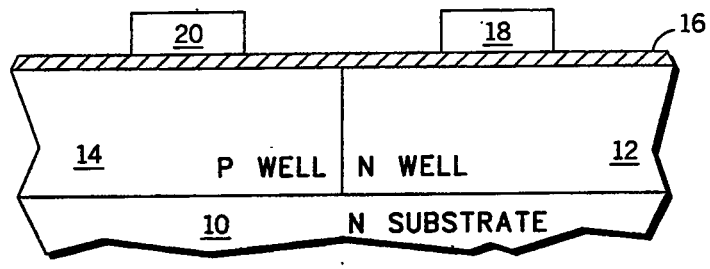
FIGS. 1–9 are schematic, cross-sectional illustrations showing the various stages of the process for the improved salicided source/drain structure of the present invention.

FIG. 1A illustrates the initial fabrication of two transistors of opposite conductivity type. For convenience of illustration, commonly duplicated elements in FIGS. 1 thru 9 are consistently identified by the same number. The process begins with the formation of twin tubs on a n-type silicon substrate 10, one well of n-type conductivity 12, and the other p-type conductivity 14. The schematic, cross-sectional illustrations do not shown the isolation between N-well 12 and P-well 14, which are formed using techniques well know in the semiconductor arts. A layer of gate oxide 16 is formed on the surface of the substrate 10 over well regions 12 and 14. A layer of polycrystalline silicon (hereinafter referred to as poly) is deposited on the layer of gate oxide 16 over well regions 12 and 14. In the preferred embodiment, the poly layer has a thickness between 3,000 and 5,000 Å, which is slightly greater than that of a conventional CMOS structure (typically 2,000 to 4,000 Å). The increase in the poly thickness is to allow for removal of 1,000 Å during a subsequent silicon overetch. Gate regions 18 and 20 are formed by selectively etching the poly in a conventional fashion. In the preferred embodiment, gate regions 18 and 20 are formed using undoped poly, however, the present invention may be practiced using a doped poly.

Figure 2:
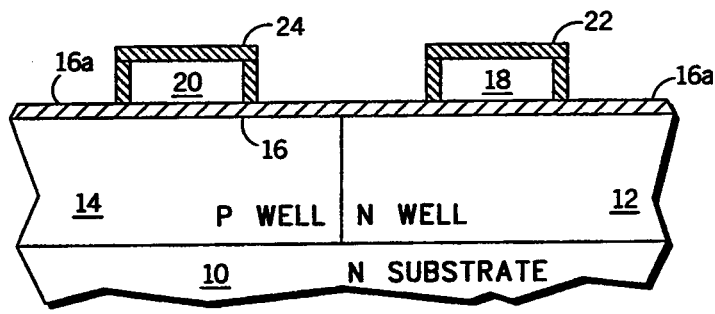
Figure 3:
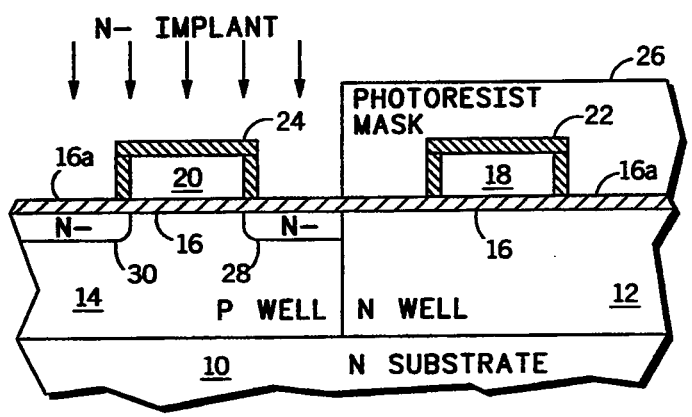

After forming gate regions 18 and 20, a reoxidation is preformed to restore the exposed gate oxide 16a which may have been damaged or removed by the selective polysilicon etch. As shown in FIG. 2, oxide regions 22 and 24 are formed on gate regions 18 and 20 by the reoxidation, which is accomplished by conventional thermal oxidation techniques. Subsequently, a resist mask 26 is placed over N-well region 12. N-conductivity material is implanted into the upper surface of P well region 14, using resist mask 26 and gate region 20 as ion implantation masks, thereby forming doped regions 28 and 30, as shown in FIG. 3. Doped regions 28 and 30 of N- conductivity will function as source and drain regions of the transistor formed in P-well region 14. Similarly, in FIG. 4 a resist mask 32 is placed over P well-region 14, and P-conductivity material is implanted into the upper surface of N well region 12, thereby forming doped regions 34 and 36. Doped regions 34 and 36 P-conductivity are aligned with the edge of gate region 18, and will function as source and drain regions of the transistor formed in N well region 12.

Figure 4:
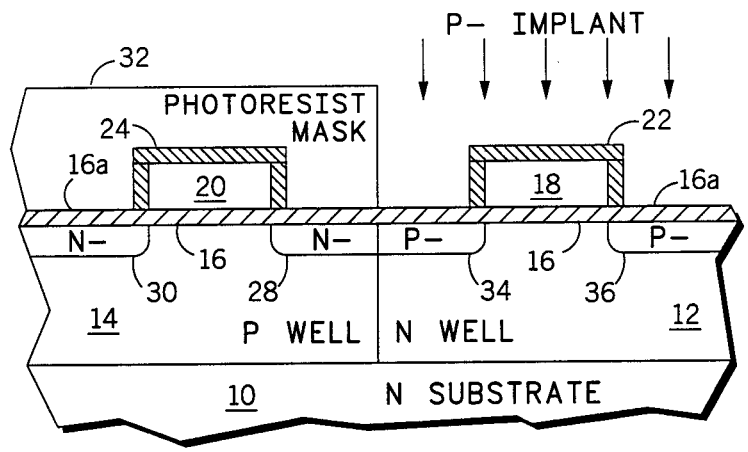
Figure 5:
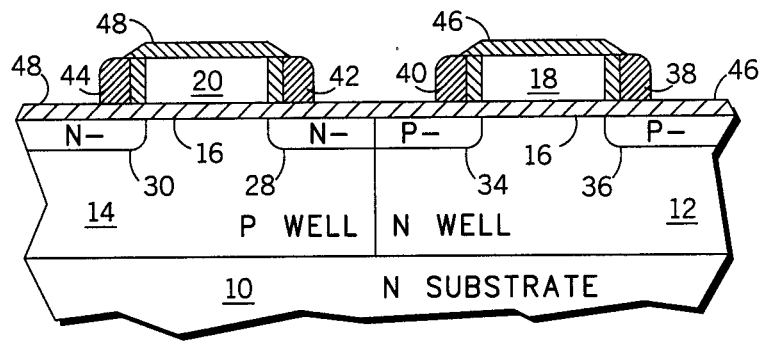

As one skilled in the art will appreciate, the photoresist mask step 26 illustrated in FIGS. 3 may be eliminated, if desired, by using a blanket N-implant to form N- source/drain regions for the transistors formed in N-well 12 and P-well 14. A heavier dose selective P-implant may be performed, immediately thereafter for compensation, in the same manner as illustrated in FIG. 4.

Sidewall spacers 38, 40, 42, and 44 are formed (FIG. 5), adjacent to gate regions 18 and 20 (respectively), by depositing a conformal layer of a low temperature oxide (LTO), or other dielectric material on the structure, including gate regions 18 and 20, and gate oxide layer 16a. Sidewall spacers 38, 40, 42 and 44 are formed by anisotropically etching the conformal layer with a reactive ion etching process. In the preferred embodiment, sidewall spacers 38, 40, 42 and 44 have a thickness (width) of approximately 1,500 to 4,000 Å. During the reactive ion etch step above, the exposed gate oxide 16a, above the source and drain regions 28, 30, 34, 36 is removed as a result of the reactive ion etch, therefore, the structure is reoxidized to insure gate oxide integrity. Screen oxide 46 is grown over the the gate region 18, and, P- source/drain regions 28 and 30. Similarly, screen oxide 48 is formed over the gate structure 20, and the N-source/drain regions 28 and 30.

Figure 6:
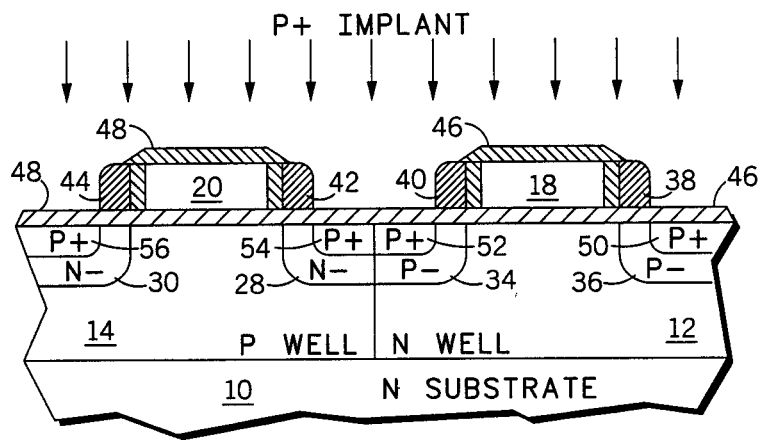

After reoxidation, a blanket P+ implantation is performed, as illustrated in FIG. 6, doping poly gate regions 18 and 20 with P+ conductivity material, and forming P+doped areas 50 52, 54 and 56. The $BF_2$ implant is performed using a dose of approximately $5 \times 10^{15}$ atoms/cm$^3$ at 65 keV. Sidewall spacers 38 and 40 serve a shielding function during the P+ implant. As a result, P+ doped areas 50 and 52 are aligned with the outside edge of sidewall spacers 38 and 40, respectively. P+ doped areas 54 and 56 are likewise aligned with the outer edge of sidewall spacers 42 and 44, respectively.

Figure 7:
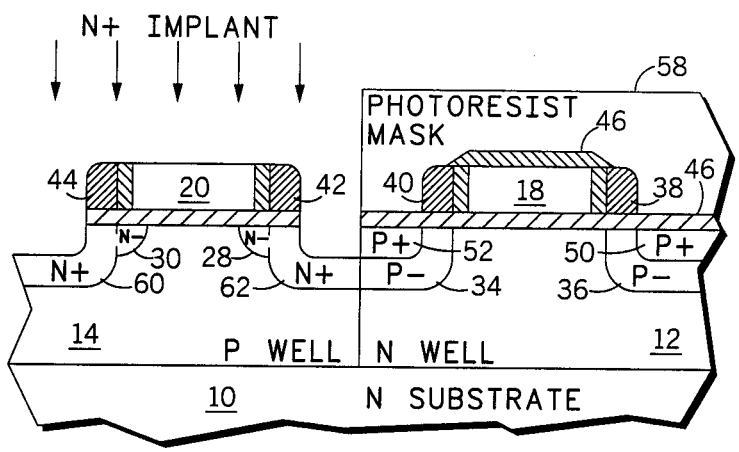

A second photoresist mask 58 is formed over N-well 12, as shown in FIG. 7. A silicon overetch is performed, using a highly selective silicon to oxide etchant. The etch should be deep enough to remove a significant portion of the P+implant in doped regions 54 and 56, and poly gate 20. In the preferred embodiment, the silicon overetch removes approximately 1,000 Å of silicon and poly, thereby decreasing the thickness of poly gate 20. As one skilled in the art will appreciate, the shape (thickness of sidewall spacers 42 and 44 may change depending upon the chemistry of the etchant. A selective N+ conductivity material is implanted into the surface P-well region 14 using resist mask 58 as an ion implantation mask. The doping level of the N+ conductivity material is higher than the doping level used for the blanket P+ implant (shown in FIG. 6), therefore, gate region 20, if undoped prior to gate etch, is completely converted to a N+ poly gate region. Doped regions 60 and 62 are formed using sidewall spacers 42 and 44 as alignment masks. In the preferred embodiment, the N+ doped regions 60 and 62 are deeper than the N-doped regions 28 and 30, however, the present invention may be practiced conversely (where the former is shallower than the latter).

Figure 8:
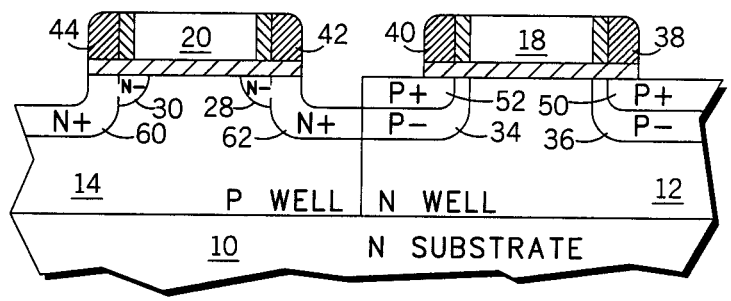
Figure 9:
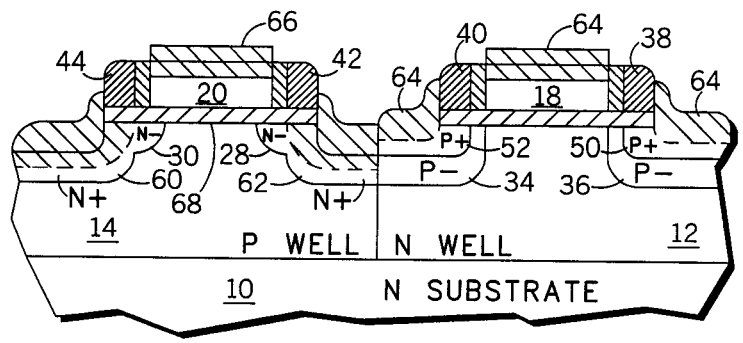

Photoresist mask 58 is removed, and screen oxide layer 46 is etched away, using conventional techniques (FIG. 8). After removing oxidation layer 46, the semiconductor substrate 10 is annealed, causing N-doped regions 28 and 30 to diffuse laterally under gate region 20, and N+ doped regions 60 and 62 to diffuse toward gate region 20. Similarly, the P-doped regions 34 and 36 diffuse slightly under gate region 18. An alternate approach is to anneal the semiconductor substrate 10 before etching the oxide. A refractory metal, for example titanium, is deposited on top of semiconductor substrate 10 and annealed, thereby forming self-aligning silicide (titanium disilicide) layers 64 and 66, on the exposed silicon and polycrystalline silicon portions of semiconductor substrate 10 (FIG. 9). The concave geometry of the N+doped regions 60 and 62 allows silicide formation 66 closer to the edge of the channel 68, thereby reducing the the series resistance of the n-channel transistor formed in P-well 14. The series resistance of the n-type transistor is lower due to the proximity of the edge of silicide layer 66 to the edge of the channel region 68. Essentially, the use of sidewall spacers 42 and 44 for the N+ion implantation mask, and the silicide formation facilitates the closer spacing of the silicided region 66 to channel edge 68.

While the present invention is disclosed in the context of a preferred embodiment, it will be apparent to those skilled in the art that the present invention may be practiced in numerous ways other than that specifically described above. For example, although the invention has been described as a twin well process, a P-well or N-well process can also be used. Furthermore, other silicide materials, such as tantalum, cobalt, tungsten, or the like may be used to form the salicide material. Accordingly, it is intended by the appended claims to cover all modifications of the invention which fall within the true spirit and scope of the invention.

I claim:

1. A process for fabricating a CMOS device comprising the steps of:

providing a silicon substrate having first and second surface regions of first and second conductivity type, respectively;

providing first and second polycrystalline silicon gate electrodes overlying said first and second surface regions;

forming source and drain regions of second and first conductivity type, respectively, self aligned with said first and second gate electrodes;

forming sidewall spacers on the edges of each of said gate electrodes;

introducing impurities of said first conductivity type into said first and second surface regions using said sidewall spacers as masking elements;

removing said impurities of said first conductivity type from said surface region of said first conductivity type by overetching of said substrate surface;

selectively introducing impurities of second conductivity type into said surface region of said first conductivity type using said sidewall spacers as masking elements; and forming silicide regions on said first and second surface regions using said sidewall spacers as silicide masks.

2. The process of claim 1 wherein a thin dielectric material region is formed over selective areas of said silicon substrate, including said gate electrodes of said first and second regions, by oxidizing said exposed polycrystalline silicon surface.

3. The process of claim 1 wherein said source and drain regions of first and second conductivity type are formed by ion implantation.

4. The process of claim 1 wherein said step of forming a silicide region on said first and second surface regions comprises:

depositing a refractory metallic material over said first and second surface regions, using said sidewall spacers as silicide masks;

annealing said refractory metallic material to form said silicide region said first and second surface regions.

5. The process of claim 5 wherein the refractory metal comprises titanium.

* * * * *

UNITED STATES PATENT AND TRADEMARK OFFICE
CERTIFICATE OF CORRECTION

PATENT NO. : 4,876,213

DATED : October 24, 1989

INVENTOR(S) : James Ruhl Pfiester

It is certified that error appears in the above-identified patent and that said Letters Patent is hereby corrected as shown below:

In column 4, line 64, after "said silicide region" insert --on--.

Signed and Sealed this

Fourth Day of February, 1992

Attest:

HARRY F. MANBECK, JR.

*Attesting Officer*            *Commissioner of Patents and Trademarks*